United States Patent
Holle et al.

(10) Patent No.: US 7,408,152 B2
(45) Date of Patent: Aug. 5, 2008

(54) ION SOURCE USING MATRIX-ASSISTED LASER DESORPTION/IONIZATION

(75) Inventors: Armin Holle, Oyten (DE); Jens Höhndorf, Bremen (DE); Andreas Haase, Bremen (DE); Markus Kayser, Bremen (DE)

(73) Assignee: Bruker Daltonik GmbH, Bremen (DE)

( * ) Notice: Subject to any disclaimer, the term of this patent is extended or adjusted under 35 U.S.C. 154(b) by 384 days.

(21) Appl. No.: 11/314,966

(22) Filed: Dec. 21, 2005

(65) Prior Publication Data
US 2006/0169914 A1 Aug. 3, 2006

(30) Foreign Application Priority Data
Dec. 22, 2004 (DE) .................. 10 2004 061 820.8

(51) Int. Cl.
*B01D 59/44* (2006.01)
*H01J 49/00* (2006.01)
(52) U.S. Cl. .................. 250/288; 250/423 P; 250/281; 250/282; 250/287; 250/425
(58) Field of Classification Search .......... 250/288, 250/423 P, 281, 282, 287, 425
See application file for complete search history.

(56) References Cited

U.S. PATENT DOCUMENTS

| | | | |
|---|---|---|---|
| 5,121,398 | A | 6/1992 | Rao |
| 6,806,464 | B2 | 10/2004 | Stowers et al. |
| 6,953,928 | B2 | 10/2005 | Vestal et al. |
| 2002/0154663 | A1 | 10/2002 | Zhu et al. |
| 2002/0155483 | A1 | 10/2002 | Holle et al. |
| 2002/0172251 | A1 | 11/2002 | Ohtsuka et al. |
| 2003/0025074 | A1 | 2/2003 | Li |
| 2003/0155499 | A1 | 8/2003 | Axelsson |

FOREIGN PATENT DOCUMENTS

| | | |
|---|---|---|
| DE | 42 20 705 C2 | 6/1992 |
| EP | 0 468 632 A3 | 1/1992 |
| WO | WO 02/061799 A3 | 8/2002 |

OTHER PUBLICATIONS

Koechner, et al., "Survey of solid-state laser materials", Springer-Verlag New York Inc., pp. 31-74 and 492-500, 1976.

Dreisewerd, Klaus, "The Desorption Process in MALDI", Chemical Reviews, American Chemical Society, pp. A-AE, 2002.

Ogilvy, et al., "Efficient diode double-end-pumped Nd: $YVO^4$ laser operating at 1342nm", Optics Express, vol. 11, No. 19, pp. 2411-2415, 2003.

Shen, et al., "1079.5- and 1341.4-nm: larger energy from a dual-wavelength Nd:$YAIO^3$ pulsed laser", Applied Optics, vol. 32, No. 30, pp. 5952-5957, 1993.

Andreas, V., "Der Scheibenlaser: Theoretische Grundlagen des Dauerstrichbetriebs und erste experimentelle Ergebnisse anhand von Yb: YAG", Dissertation, München 2002, S. 34.

*Primary Examiner*—Jack I. Berman
*Assistant Examiner*—Meenakshi S Sahu
(74) *Attorney, Agent, or Firm*—Law Offices of Paul E. Kudirka

(57) ABSTRACT

An ion source generating ions by matrix-assisted laser desorption/ionization (MALDI) comprising a MALDI sample support and a solid-state the laser system generating a pulsed laser beam, which has a wavelength in the range between 332 and 342 nanometers and is spatially shaped in the solid-state laser system such that the spatial intensity distribution of the laser beam on the MALDI sample support exhibits more than one intensity peak.

12 Claims, 3 Drawing Sheets

ION SOURCE USING MATRIX-ASSISTED LASER DESORPTION/IONIZATION

FIELD OF THE INVENTION

The invention relates to an ion source generating ions by matrix-assisted laser desorption/ionization utilizing a solid-state laser system.

BACKGROUND OF THE INVENTION

In the last 10 to 15 years, two methods have prevailed in mass spectrometric analysis for the soft ionization of biological macromolecules: ionization by matrix-assisted laser desorption (MALDI), and electrospray ionization (ESI). The biological macromolecules analyzed will be termed analyte molecules below. With the MALDI method, the analyte molecules are generally prepared on the surface of a sample support in a solid matrix, whereas with the ESI method they are dissolved in a liquid. Both methods have a considerable influence on the mass spectrometric analysis of biological macromolecules in genomics, proteomics and metabolomics; their inventors were awarded the Nobel prize for chemistry in 2002.

In a prepared MALDI sample, there are $10^3$ to $10^5$ times more matrix molecules than analyte molecules, and they form a polycrystalline, solid matrix in which the analyte molecules are integrated, either scattered in the interior of the crystals or at their grain boundaries. The prepared MALDI sample is irradiated with a short laser pulse, which is strongly absorbed by the matrix molecules. By the pulsed irradiation, the solid matrix is explosively transferred into the gaseous phase of a vaporization cloud (desorption). The analyte molecules are usually ionized by being protonated or deprotonated in reactions with matrix molecules or matrix ions, the analyte ions being predominantly singly charged after leaving the vaporization cloud. The degree of ionization of the analyte molecules is only around $10^{-4}$. The MALDI method is termed soft ionization because an analyte molecule is transferred in isolation into the gaseous phase and ionized, without undergoing dissociation.

Despite the linear absorption by the matrix, matrix-assisted laser desorption/ionization is a nonlinear process, which only starts above an intensity threshold of around $10^6$ watts per square centimeter using laser pulses with duration of a few nanoseconds. For soft ionization, the maximum intensity lies at an upper limit of approximately $10^7$ watts per square centimeter. With a typical duration of around ten nanoseconds, the stated intensity limits produce a fluence of between 10 and 100 millijoules per square centimeter.

The MALDI process is complex and affected by numerous factors, some of which are interdependent. Since the MALDI method was first published in 1988, many chemical and physical parameters have been investigated and varied. The chemical parameters are, for example, the type of matrix substances themselves, the concentration ratio between matrix and analyte molecules and the preparation conditions. As far as the physical parameters are concerned, until now the temporal duration of the laser pulses, the intensity in the laser focus and the wavelength of the pulsed laser beam have mainly been considered. In spite of intensive research, the processes in the matrix and in the vaporization cloud which lead to the ionization of the analyte molecules are still not completely understood (K. Dreisewerd, Chem. Rev. 103 (2003), 395-425: "The Desorption Process in MALDI").

Nowadays, pulsed laser systems in the ultraviolet spectral range (UV) are used in the vast majority of MALDI mass spectrometers. In principle, various laser types and wavelengths A are available in the UV: nitrogen lasers ($\lambda=337$ nm), excimer lasers ($\lambda=193$ nm, 248 nm, 308 nm) and Nd:YAG lasers ($\lambda=266$ nm, 355 nm). Commercially, however, only the nitrogen laser with a wavelength of 337 nanometers and the Nd:YAG laser at 355 nanometers are of interest, the nitrogen laser being far and away the one most frequently used. The duration of the laser pulses used in the UV MALDI mass spectrometers is typically between 1 and 20 nanoseconds.

Depending on the chemical substance classes, for example proteins or nucleic acids, over one hundred different chemical matrix substances are known for the analyte molecules, such as sinapic acid, DHB (2,5-dihydroxy benzoic acid), CHCA (α-cyano-4-hydroxy cinnamic acid) or HPA (3-hydroxypicolinic acid). All these matrix substances exhibit strong absorption in the wavelength range between 330 and 360 nanometers. Furthermore, a MALDI sample can be prepared in a number of different ways, depending on the application, for example with the "dried droplet" preparation method or thin layer preparation.

Nitrogen lasers are most widely used in MALDI mass spectrometry at present. The laser medium is gaseous nitrogen, which is excited by means of an electrical discharge between two electrodes. The most intensive laser line at 337 nanometers exhibits such a high amplification that a single laser pulse can reduce the population inversion of the energy states even if it sweeps the electrodes only once. Even when cavity mirrors are used, numerous transverse beam modes are excited and superimpose themselves in the beam profile of the laser beam. From the field of optics we are familiar with the fact that a laser beam of this type cannot be brought to a diffraction-limited focus. At a wavelength of 337 nanometers, the laser focus therefore has a minimum diameter of only three micrometers. However, the diameter of the irradiated area on the MALDI sample is typically between 20 and 200 micrometers. The beam profile of the nitrogen laser has an almost rectangular flat top at the electrodes, the width and the height of the beam profile being determined by the width of the discharge electrodes and their separation respectively. In principle, an electrical gas discharge is not equal at all points between the electrodes, resulting in a spatially inhomogeneous amplification. The short time the laser is in action means that this inhomogeneity is not evened out but is instead transferred to the beam profile of the nitrogen laser. Consequently, although the nitrogen laser has a flat-top beam profile when integrated over many laser shots, the profile is spatially modulated in the single shot and exhibits intensity maxima and minima.

A disadvantage of the nitrogen laser is that the repetition rate of the laser pulses is limited to around 100 hertz unless provision is made for a rapid gas exchange. In MALDI mass spectrometers the nitrogen lasers are therefore usually operated at a repetition rate of 50 Hertz at the most. More serious than the limited repetition rate, however, is the short life time. For commercially available nitrogen lasers the life time is around $10^7$ laser pulses before maintenance is necessary. The life time of the nitrogen laser is presumably limited by the fact that the electrical gas discharge causes wear to the electrodes and the laser medium. With a laser pulse repetition rate of 50 Hertz and a daily operating time of only one hour this means the life time is just two months, very low by industrial standards. Furthermore, a pulsed gas discharge is normally difficult to reproduce, so that the intensity distribution in the beam profile and the energy fluctuate from laser pulse to laser pulse.

The great advantage of the nitrogen laser in MALDI mass spectrometry is that a large number of suitable matrix substances are available for this type of laser, for example sinapic acid, DHB or CHCA. The matrix substances and the preparation specifications which have been compiled for them are adapted for different applications and classes of analyte molecules. The wavelength of the nitrogen laser seems to lie in the best possible region for soft ionization, a fact which is borne out not least by the prevalence of the nitrogen laser.

The quality of a MALDI mass spectrum generally increases with the absorption of the MALDI matrix, although differences will level out, if the absorption exceeds a certain value (Dreise-werd: "The Desorption Process in MALDI", Chem Rev, 103, 2003). Above a wavelength of 380 nanometers there is a serious decrease of absorption and thus a loss of performance in the MALDI process for standard matrix substances, such as CHCA or DHB. A lower limit is imposed by the undesirable excitation of electronic states in the aromatic rings of the matrix and analyte molecules. On the basis of measured absorption spectra of the matrix substances, it can be estimated that the absorption remains constant if the wavelength of the laser pulses deviates less than five nanometers from the wavelength of the nitrogen laser at 337 nanometers. With a wavelength difference of less than two nanometers there are no wavelength-specific differences for the MALDI process whatsoever.

In addition to the nitrogen laser, the Nd:YAG laser is also used in MALDI mass spectrometers. The Nd:YAG is a solid-state laser whose laser medium is a YAG crystal (yttrium aluminum garnet:$Y_3Al_5O_{12}$) doped with neodymium ions. The strongest and most frequently excited laser line lies at a wavelength of 1064 nanometers. This laser frequency can be doubled, tripled or quadrupled by non-linear optical processes, so that in addition to the fundamental wavelength of 1064 nanometers "new" wavelengths at 532 nanometers, 355 nanometers and 266 nanometers arise. The tripled fundamental frequency at a wavelength of 355 nanometers is the one which is almost always used in MALDI mass spectrometers. Solid-state lasers often have a spatial beam profile consisting of one transverse fundamental mode or a small number of transverse beam modes. If this type of laser beam is focused or imaged onto the sample, then there is a Gaussian or almost Gaussian intensity distribution with a single maximum (intensity peak) on the sample. The half-width of the intensity peak is the maximum separation between two points (on the sample) at which the intensity of the maximum has fallen to half the value. In the UV, the half-width of an intensity peak can be less than one micrometer.

The great advantages of the Nd:YAG laser compared with the nitrogen laser are the high repetition rate of the laser pulses, the low energy fluctuations between individual laser pulses and the long life time. The repetition rate can be over 100 kHz. If an Nd:YAG crystal is excited by a diode laser, the life time of a pulsed Nd:YAG laser is around $10^9$ laser pulses. This makes the life time of the Nd:YAG laser a hundred times longer than that of a typical nitrogen laser.

Previous experience has shown that the disadvantage of the Nd:YAG laser is that it is less efficient than the nitrogen laser in most MALDI applications. One possible reason is that the wavelength of 355 nanometers which is used differs by 18 nanometers from the wavelength of the nitrogen laser. Changing the laser systems in the MALDI mass spectrometer from a nitrogen laser to a Nd:YAG laser is usually very time-consuming for the user since the operating specifications which have been compiled and optimized for the nitrogen laser have to be re-evaluated.

In U.S. Pat. No. 6,953,928 B2 Vestal et al. disclose a MALDI mass spectrometer utilizing a Nd:YAG laser. They state once only in the description that the Nd:YAG laser has a wavelength of 335 nanometers. It is evident that the wavelength of 335 nanometers is a typographical error, since the used MALDI mass spectrometer is a commercially available 4700 Proteomics Analyzer by Applied Biosystems® working at a standard wavelength of 355 nanometers as can be seen in the manual. A Nd:YAG laser emitting at a wavelength of 335 nanometers is not available at present.

For the mass spectrometric analysis of the analyte ions generated in the MALDI process, both conventional sector field mass spectrometers and quadrupole mass spectrometers as well as quadrupole ion trap mass spectrometers and ion cyclotron resonance mass spectrometers are possible, in principle. Particularly suitable, however, are time-of-flight mass spectrometers with axial injection which require a pulsed current of ions to measure the time-of-flight (TOF). In this case, the starting time for the time of flight measurement is dictated by the ionizing laser pulse. The MALDI process was originally developed for use in a vacuum. In more recent developments, matrix-assisted laser desorption/ionization is also used at atmospheric pressure (AP MALDI ). Here, the ions are generated with a repetition rate of up to 2 kilohertz and can be fed with the help of an ion guide to a time-of-flight mass spectrometer with orthogonal injection (OTOF—"orthogonal time-of-flight"), a quadrupole ion trap mass spectrometer or an ion cyclotron resonance mass spectrometer. In an OTOF mass spectrometer, the ions generated in the MALDI process can be fragmented and stored before measurement of the time-of-flight with electronic pulsed ejection is commenced.

There are imaging mass spectrometric analytical methods (IMS), in which the MALDI process is used to generate the ions. With IMS, a thin section of tissue obtained, for example, from a human organ using a microtome, is prepared with a matrix substance and analyzed spatially resolved using a mass spectrometer. The spatial resolution of the mass spectrometric analysis can be achieved either by scanning individual spots of the tissue section or by stigmatic imaging of the ions generated. With the scanning method the pulsed laser beam is focused onto a small diameter on the sample, and a mass spectrum is measured for each individual pixel. The spatial distributions (in one or two dimensions) of individual proteins are produced from the plurality of individual spatially resolved mass spectra. With stigmatic imaging in a TOF mass spectrometer, an area of up to 200 by 200 micrometers is irradiated homogeneously with a laser pulse. The ions generated in this way are imaged ion-optically pixel by pixel onto a spatially resolving detector. Until now it has only been possible to scan the spatial distribution of one ion mass with a single laser pulse because no spatially resolving ion detectors are available that are fast enough for. The measured ion mass can, however, be varied from laser pulse to laser pulse.

SUMMARY OF THE INVENTION

The invention consists in an ion source generating ions by matrix-assisted laser desorption/ionization comprising a solid-state laser system, which emits a pulsed laser beam in the wavelength range between 332 and 342 nanometers and spatially shapes the laser beam such that the intensity distribution on the MALDI sample support of the ion source exhibits more than one intensity peak.

One fundamental principle behind the invention consists in the laser system being solid-state laser system. A MALDI ion source according to the invention has a considerably longer life time and generates ions at a much higher repetition rate than a MALDI ion source utilizing a nitrogen laser. The wavelengths between 332 and 342 nanometers deviate so little from the wavelength of the nitrogen laser that there is no effect on the analytical performance of the MALDI mass spectrometer and it is possible to use previous analytical records.

Moreover, the invention is based on the surprising discovery that matching the wavelength to that of the nitrogen laser is usually not sufficient for replacing the nitrogen laser. In addition, the spatial intensity distribution of the nitrogen laser on the MALDI sample has to be taken into consideration and reproduced in order to achieve the efficiency of the nitrogen laser in a MALDI mass spectrometer. The intensity distribution on the sample produced by a laser system according to the invention usually exhibits a large number of intensity peaks, in which the intensity has local maxima. A very important advantage over the Nd:YAG lasers used until now is that a user can change from a nitrogen laser to a solid-state laser system without having to change the preparation and measuring specifications.

In the following, the laser system of the MALDI ion source is understood to be the complete set-up comprising optical, electrical and electro-optical components which are necessary to generate and shape (spatially and/or temporally) the laser beam from the laser medium to the sample. This comprises the laser medium, the excitation of the laser medium, an optical resonator as well as the necessary optical and electro-optical components to shape the laser beam in space and time, for example lenses, mirrors, active and passive Q-switches for pulse generation, the coupling into an optical fiber, and nonlinear optical crystals.

In order to generate a laser beam in the desired wavelength range between 332 and 342 nanometers it is not necessary that the laser medium emits directly in this wavelength range. Nonlinear optical processes familiar to those skilled in the art, such as higher order harmonic generation or frequency mixing, allow the conversion of the wavelength emitted by the laser medium into the required wavelength range. The laser medium can therefore also emit a laser beam in the wavelength ranges between 664 and 684 nanometers, between 996 and 1026 nanometers or between 1328 and 1368 nanometers, for example, and this laser beam is then converted into the desired wavelength range by a higher order harmonic generation in nonlinear crystals.

Several crystals or glasses doped with ions can be used as laser medium and emit a laser beam at wavelengths which can be converted into the desired wavelength range by frequency multiplication. These preferably include the yttrium ortho-vanadate crystal ($Nd:YVO_4$) and the ortho-yttrium aluminate crystal ($Nd:YAlO_3$), which are both doped with neodymium ions and can be very effectively excited to laser action at fundamental wavelengths of 1342 and 1341 nanometers respectively (H. Y. Shen et al.: "1079.5- and 1341.4-nm: larger energy from a dual-wavelength $ND:YAlO_3$ pulsed laser", App. Opt., Vol. 32, No. 30, 1993; H. Ogilvy et al.: "Efficient diode double-end-pumped $Nd:YVO_4$ laser operating at 1342 nm", Opt. Exp., Vol. 11, No. 19, 2003). Frequency multiplication generates wavelengths at 335.5 and 335.25 nanometers, which deviate only slightly from the wavelength of the nitrogen laser at 337 nanometers. There are other suitable crystals doped with neodymium ions, for example the lanthanum scandium borate crystal ($Nd:LSB$ or $Nd:LaSc_3[BO_3]_4$) and the potassium gadolinium tungstate crystal ($Nd:KGW$ or $Nd:KGd[WO_4]_2$) with fundamental wavelengths of 1348 and 1351 nanometers respectively.

Apart from the most intensive laser line at 1064 nanometers, the Nd:YAG crystal also exhibits other common laser lines, such as at the 1319 nanometer wavelength. However, the frequency multiplications of all laser lines of the Nd:YAG crystal which can be effectively excited in a laser system suitable for commercial applications deviate so far from the wavelength of the nitrogen laser that the Nd:YAG crystal does not represent a suitable laser medium for a laser system according to the invention.

Semiconductors can also be used as a laser medium in laser systems according to the invention. In semiconductor lasers, the laser medium is excited either optically or by an electric current flow. As a result, the diverse applications of semiconductor lasers (also known as diode lasers or laser diodes) range from pumping solid-state lasers through to material processing, and also telecommunications and data storage, to give only a few examples. The semiconductor lasers commercially available at present emit wavelengths in the blue and ultraviolet spectral range between 375 and 440 nanometers as well as in the red and infrared spectral range above 630 nanometers.

The continuous development of the semiconductor laser in the field of data storage will, in the future, make it possible for semiconductor lasers in the wavelength range of the nitrogen laser to emit a laser beam which obviates the need for complicated and costly nonlinear wavelength conversions and makes it possible to have reasonably priced laser systems in MALDI mass spectrometers.

On the other hand, commercially available semiconductor lasers can already generate laser beams in the desired wavelength range between 332 and 342 nanometers if nonlinear optical processes are exploited. One important advantage of the semiconductor laser here is that the fundamental wavelength can be selected by the materials and geometric structures used in the manufacturing process. Semiconductor lasers can be produced which precisely correspond to twice, or a multiple of, the wavelength of the nitrogen laser, e.g. at 674 or 1348 nanometers. Using the operating parameters such as the temperature, it is also possible to change the emitted wavelength within certain limits.

As those skilled in the art are aware, a temporally pulsed laser beam (laser pulses) can be generated by a wide range of different means, for example by active Q-switching, a passive saturable absorber or a pulsed excitation of the laser medium. The possible and effective ways of generating the laser pulses differ, depending on the particular construction of the laser system or laser medium. With a semiconductor laser it is possible, for example, to generate laser pulses by exciting the laser medium with a temporally pulsed current flow.

As explained above, the invention is based on the recent discovery that a MALDI mass spectrometer often only achieves the same, or even a better, analytical performance when the laser system of the MALDI ion source generates a spatially modulated intensity distribution on the MALDI sample support. This provides a wide range of options for those skilled in the art to produce a spatially modulated intensity distribution on the MALDI sample support.

On the one hand, the solid-state laser system of a MALDI ion source according to the invention can incorporate a device which spatially shapes the beam profile of the laser beam. In this case, the phase front, the intensity of the beam profile, or both of these together, can be shaped. Lens arrays, digital optical elements (DOE), or simple masks, which completely or partially absorb, reflect or scatter the laser beam at several points, for example, can be used for the spatial shaping. The intensity of the beam profile can also be spatially shaped after passing through a so-called multimode fiber. A suitable optical beam path transfers the spatial shape of the beam profile into a spatially modulated intensity distribution on the sample. A device of this type is especially important when the beam profile of the laser beam consists of only one mode or a small number of beam modes. Without an additional spatial shaping, the intensity distribution on the sample (in contrast to the nitrogen laser) exhibits only a single intensity peak when the laser beam is focused or imaged onto the MALDI sample support of the MALDI ion source. The spatial shaping of the beam profile can occur at any point in the laser system, for example inside the optical resonator or between the optical resonator and the sample, or when the laser action is excited.

On the other hand, the laser beams can be spatially shaped in the solid-state laser system by using more than one laser medium or by using beam splitters, for example, to split the laser beam. If the split laser beam is spatially recombined on the MALDI sample support, then an intensity distribution can be generated there which is spatially modulated and which comprises a large number of intensity peaks.

The spatial intensity distribution on the MALDI sample support of the MALDI ion source is described by various parameters, such as the number of intensity peaks, their maximum intensity and position on the sample as well as by the intensity in the region between intensity peaks. The half-width is a further important parameter. The spatially modulated intensity distribution on the sample here can be completely or partially adjustable.

BRIEF DESCRIPTION OF THE DRAWINGS

The above and further advantages of the invention may be better understood by referring to the following description in conjunction with the accompanying drawings in which.

DETAILED DESCRIPTION

Figure 1:
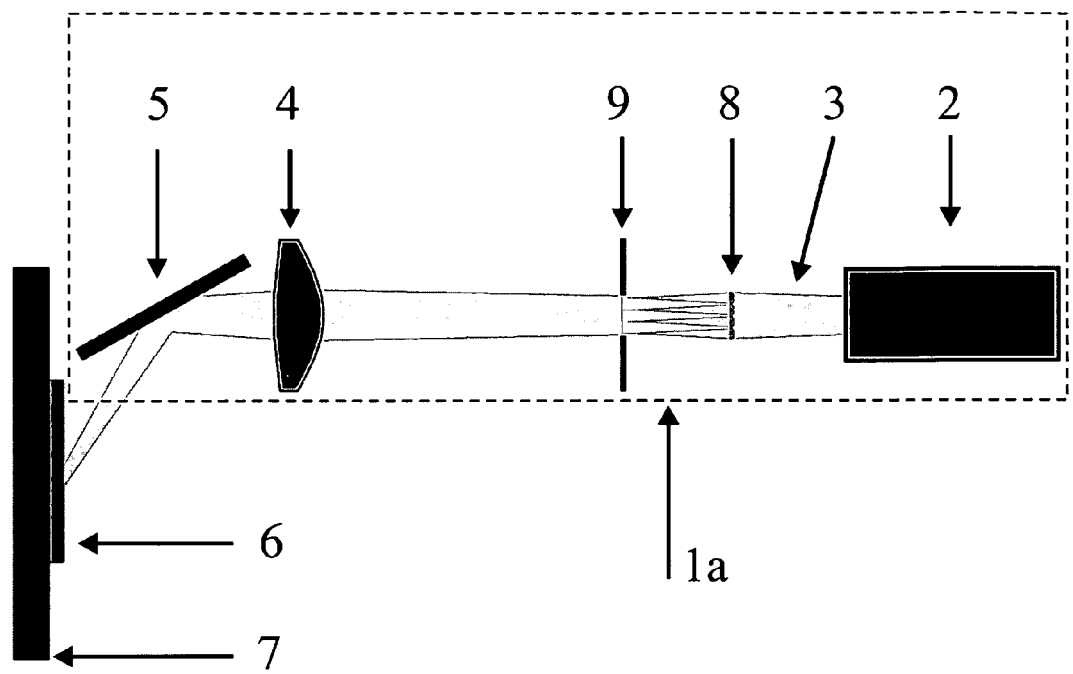
FIG. 1 shows the schematic representation of a MALDI ion source with a MALDI sample support (7) and a solid-state laser system (1a) in which the beam profile of a laser beam (3) is spatially shaped by a lens array (8)

FIG. 1 shows an embodiment of a MALDI ion source according to the invention with a MALDI sample support (7) and a solid-state laser system (1a). In the laser unit (2) a pulsed laser beam (3) with a wavelength between 332 and 342 nanometers is generated whose spatial beam profile exhibits a laser beam with an almost single mode and illuminates the lens array (8). This lens array (8), consisting of two-dimensionally arranged lenses, generates spatially separate foci in the plane of the apertured diaphragm (9), which are imaged onto the MALDI sample support (7) in reduced size by the lens (4) and the tilting mirror (5). The spatially separate foci create an intensity distribution comprising many individual intensity peaks on the MALDI sample (6). The laser unit (2) contains the laser medium, the means required to excite the laser and temporally shape the pulses, as well as a variable attenuator.

Together with other samples not shown, the MALDI sample (6) is prepared on a MALDI sample support (7) and contains the analyte molecules integrated into a matrix. If the threshold intensity for the MALDI process on the MALDI sample (6) is exceeded, the explosive evaporation of the matrix begins. The analyte molecules are transferred with the matrix into the gaseous phase and a certain proportion of them are present as analyte ions in the vaporization cloud. The tilting mirror (5) spatially separates the laser system (1a) from the MALDI sample support (7) of the MALDI ion source, making it easier to transfer the ions generated in the MALDI process into a mass spectrometer.

Between the intensity peaks, the MALDI sample (6) may not be ionized uniformly, so that the MALDI sample (6) is only slightly ionized, or possibly not at all, at some points. In order to use up a MALDI sample (6) as completely as possible with a sequence of laser pulses, it can be necessary to change the position of the modulated intensity distributions generated on the MALDI sample (6) or to generate a different spatial intensity distribution on the MALDI sample (6). This can be achieved by mechanically moving the lens array (8), the lens (4), the tilting mirror (5) or the MALDI sample support (7) during a sequence of laser pulses, for example. In the same way it is also possible to generate analyte ions from the samples that are located next to the MALDI sample (6) on the MALDI sample support (7).

Figure 2:
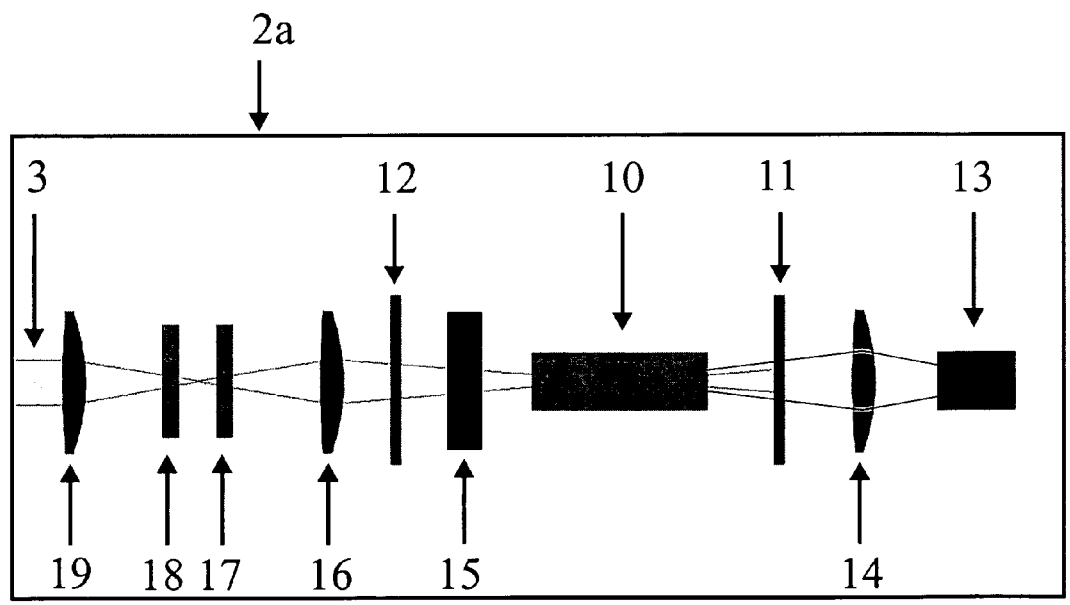
FIG. 2 shows a laser unit (2a) in which the laser medium is a rod-shaped YAlO$_3$ crystal (10) doped with neodymium ions.

FIG. 2 shows the laser unit (2a) of a solid-state laser system, in which a YAlO$_3$ crystal doped with neodymium ions (Nd:YAlO$_3$ crystal) serves as the laser medium. The energy states of the neodymium ions in the YAlO$_3$ crystal facilitate laser action at a fundamental wavelength of 1341 nanometers. Nonlinear optical processes in the crystals (17) and (18) generate a laser beam at a wavelength of 335.25 nanometers, which deviates less than two nanometers from the wavelength of the nitrogen laser.

The Nd:YAlO$_3$ crystal (10) is rod-shaped and is optically pumped by a continuously operated diode laser (13). The diode laser (13) emits at a wavelength of 808 nanometers and is focused by the lens (14) into the Nd:YAlO$_3$ crystal (10). It is obvious to those skilled in the art that geometries used in disk, fiber and slab lasers, for example, are also possible for the laser medium. The Nd:YAlO$_3$ crystal (10) can also be pumped with a flash lamp, for example, instead of with the diode laser (13).

The two mirrors (11) and (12) form the optical resonator of the laser unit (2a). The spectral reflecting power of the mirrors is chosen so that the Nd:YAlO$_3$ crystal (10) is effectively pumped by the diode laser (13) and the laser action at 1341 nanometers is given priority. The Q-switch (15) is electrically actuated via an external driver signal and temporally modulates the losses of the laser beam in the optical resonator. With this active Q-switching the laser unit (2a) generates a pulsed laser beam with duration of around 2 nanoseconds. It is preferable if the Q-switch (15) consists of a Pockels cell, with which the polarization of the laser beam emitted by the Nd:YAlO$_3$ crystal can be actively influenced via the electro-optical Pockels effect, and also of suitably selected passive polarization optics, such as polarizers and λ/4-deceleration plates.

The lens (16) focuses the pulsed laser beam onto two nonlinear optical lithium triborate crystals (17) and (18) (LiB$_3$O$_5$, LBO). The crystal axis of the two LBO crystals and their angular adjustment in relation to the laser beam are each chosen so that the LBO crystal (17) converts the fundamental wavelength into the 671 nanometer wavelength and the LBO crystal (18) halves this wavelength once again to 335.25 nanometers. After the LBO crystal (18), the pulsed laser beam is composed of the three wavelengths at 1341, 671.5 and 335.25 nanometers. Since only the 335.25 nanometer wavelength is used for the MALDI process, the two other wavelengths are filtered out with filters which are not shown.

For those skilled in the art it is obvious that all crystals or glasses doped with ions can be used in which the fundamental wavelength of the laser medium lies in the desired wavelength range between 332 and 342 nanometers, or can be converted into these wavelengths. The conversion here can be carried out using a single-stage process or multi-stage nonlinear processes, both outside as well as inside the optical resonator. Other possible crystals doped with ions are, for example, an the yttrium orthovanadate crystal ($Nd:YVO_4$) doped with neodymium ions, a lanthanum scandium borate crystal ($Nd:LaSc_3[BO_3]_4$) doped with neodymium ions, or a potassium gadolinium tungstate crystal ($Nd:KGd[WO_4]_2$) doped with neodymium ions.

Figure 3:
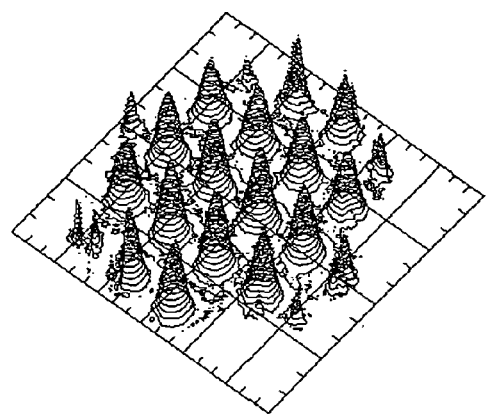
FIG. 3 shows the intensity distribution generated on the MALDI sample (6) with the laser system (1a) of FIG. 1 and the laser unit (2a) shown in FIG. 2.

FIG. 3 illustrates an intensity distribution generated with the solid-state laser system (1a) (shown in FIG. 1) and the laser unit (2a) (shown in FIG. 2) in the plane of the apertured diaphragm (9). Here a frequency-quadrupled pulsed $Nd:YAlO_3$ laser is used emitting laser pulses with a wavelength of 335.25 nanometers and a duration of around 2 nanoseconds. The pulsed laser beam (3) has an almost Gaussian beam profile in front of the lens array (8). The lens array (8) generates a large number of spatially separate foci in the plane, with a half-width of around 80 micrometers. The lenses in the lens array (8), and therefore also the individual foci in the plane of the apertured diaphragm, are arranged in a square grid with an edge length of 150 micrometers. The apertured diaphragm (9) itself has a diameter of around 750 micrometers. The lens (4) images the plane of the apertured diaphragm (9), typically reduced in size on a scale of 1:8, onto the MALDI sample support (7), so that a single intensity peak has a half-width of 10 micrometers.

Figure 4:
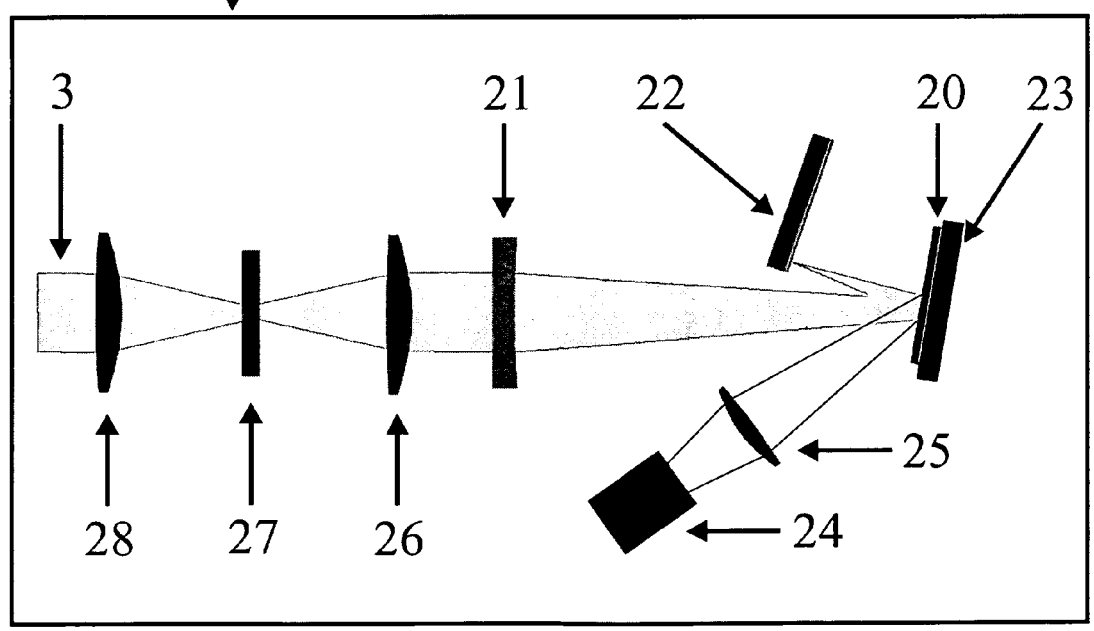
FIG. 4 shows a laser unit (2b) in which the laser medium consists of a semiconductor structure (20) made of alternate thin layers of gallium indium arsenide (GaIn)(As) and gallium arsenic phosphide (Ga)(AsP)

FIG. 4 shows a laser unit (2b) of a solid-state laser system, in which an optically pumped vertical cavity surface emitting laser (VCSEL) is used. The amplifier structure (20), the outcoupling mirror (21) and the cavity mirror (22) form the V-shaped folded optical resonator. The amplifier structure (20) performs the function of the laser medium and of a mirror with high reflecting power.

The amplifier structure (20) consists of a sequence of thin layers of semiconductor materials from the third and the fifth main groups of the periodic table, located on a gallium arsenide wafer. The amplifier structure (20) is typically 200 micrometers thick and is normally fixed to a copper heat sink (21). The active layer sequence of the laser medium consists of alternate layers of gallium indium arsenide $(Ga_xIn_{1-x})_{50}(As)_{50}$ and gallium arsenide $(Ga)_{50}(As)_{50}$. The brackets here group together the elements of the respective main groups; the parameter x states how high the percentage of gallium or indium in the elements from the third main group is. Using the parameter x, it is easy to vary the emitted wavelength of the laser beam between 900 and 1200 nanometers. If arsenic is replaced with phosphorus in the $(Ga)_{50}(As)_{50}$ layers, the range can be extended to longer wavelengths. For the laser unit (2b) the parameter x is chosen so that the laser medium emits at a maximum wavelength of 1011 nanometers, i.e. at precisely three times the wavelength of the nitrogen laser. Between the laser medium and the gallium arsenide wafer there is a sequence of aluminum arsenide and aluminum gallium arsenide layers, each having different refractive indices and forming a so-called Bragg mirror. In the region of the 1011 nanometer wavelength emitted by the laser medium the Bragg mirror reflects the laser beam almost completely. The spectral reflecting power of the two mirrors (21) and (22) of the amplifier structure (20) is a significant factor in determining the wavelength of the emitted laser beam. Above the laser medium there are electrical protective layers and a further sequence of layers which form an antireflective coating on the surface of the amplifier structure (20) so that laser beams generated in the laser medium, and amplified, can enter and leave the amplifier structure without suffering reflection losses.

The laser medium of the amplifier structure (20) is optically pumped. The pump radiation of the continuously operated diode laser (23) has a wavelength of 810 nanometers and is imaged by the lens (24), or a more complex optical system, onto the amplifier structure. The optically pumped surface here has an edge length of only around 100 micrometers.

The cavity mirror (22) comprises a saturable semiconductor absorber embedded in a layer structure with high reflecting power (SESAM—"semiconductor saturable absorber mirror"). A saturable absorber brings about the generation of laser pulses by means of passive Q-switching. On reflection at the cavity mirror (22), a low-intensity laser pulse is absorbed more strongly than a laser pulse with higher intensity. Laser pulses can thus arise out of statistical intensity fluctuations because these are further amplified in each round-trip in the amplifier structure (20) and are absorbed in the cavity mirror (22) to a lesser extent, the greater the intensity. For the laser unit (2b) this results in typical pulse durations of one nanosecond at a laser pulse repetition rate of 1 kilohertz.

After the outcoupling mirror (21), the laser pulses are preferably focused into a nonlinear optical β-barium borate crystal (27) (β-$BaB_2O_4$, BBO) with the help of the lens (26). The crystal axes and the orientation of the BBO crystal (27) in relation to the laser beam are selected so that the fundamental wavelength is converted into the 337 nanometer wavelength by a nonlinear frequency tripling. The pulsed laser beam is collimated after the crystal (27) by a second lens (28). After passing through a filter (not shown) the pulsed beam contains only the desired wavelength of the nitrogen laser.

Figure 5:
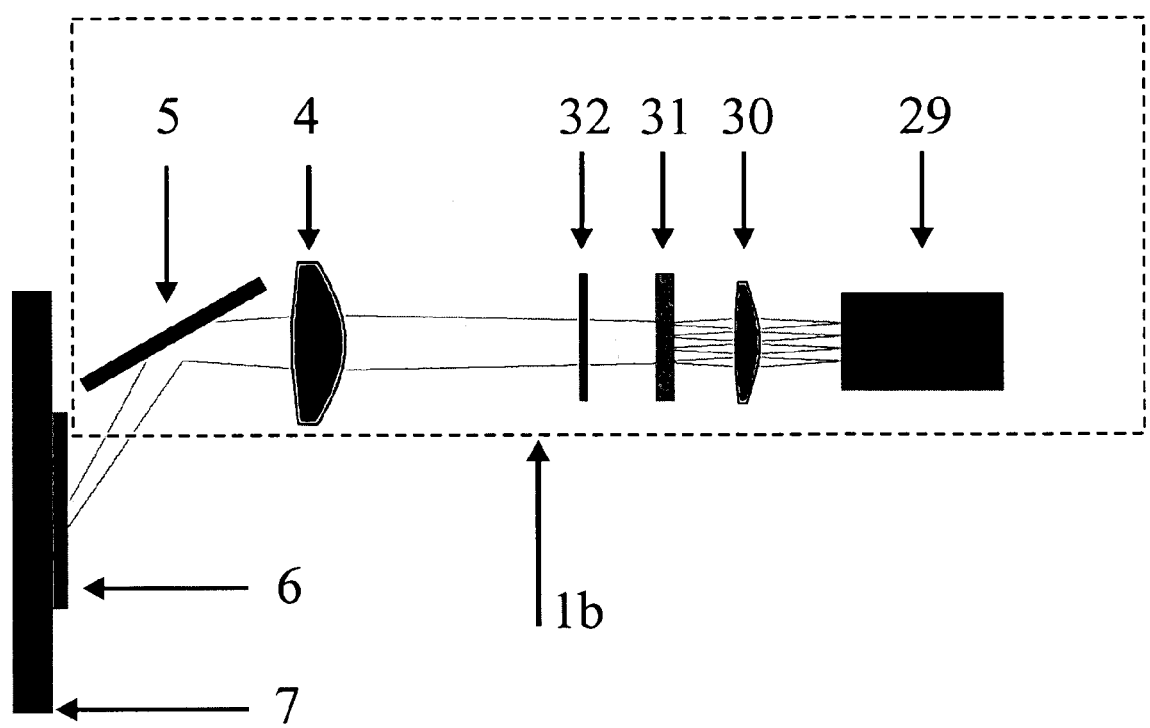
FIG. 5 shows a schematic representation of a MALDI ion with a MALDI sample support (7) and a solid-state laser system (1b) in which the laser beam is generated in an array (29) of diode lasers.

FIG. 5 shows a solid-state laser system (1b) in plan view. The pulsed laser beam is generated in a diode laser array (29) comprising not one single emitting laser medium but rather a large number of single emitters arranged in a two-dimensional array.

A typical diode laser array (29) consists of 100 single emitters arranged on a square base. It is preferable that each single emitter is a vertical cavity surface emitting laser (VCSEL) pumped directly by an electric current. The laser beam emitted by the diode laser array (29) has a wavelength of 674 nanometers, i.e. double the wavelength of the nitrogen laser. The laser medium of the individual VCSELs consists of a sequence of (Ga)(InP) and (AlGa)(InP) layers and is embedded in two Bragg mirrors made of (Al)(As) and (AlGa)(As) layers. In principle it is also possible to use edge-emitting or strip-emitting laser diodes consisting of a large number of emitting "strips" (so-called "stacks" or "bars"). In the case of a single strip emitter the laser medium comprises a homogeneous semiconductor crystal such as (Ga)(AsP) rather than a sequence of layers. A diode laser array comprising many individual strip emitters is also pumped directly by an electric current in this embodiment.

The lens (30) images the diode laser array (29) onto a BBO crystal (31). The beam profile of laser beam is spatially modulated in the plane of the BBO crystal (31) because the diode laser array (29) consists of many spatially separate single emitters.

The crystal axis and the orientation of the BBO crystal (31) are chosen so that the fundamental wavelength (674 nanometers) is converted into the 337 nanometer wavelength by a nonlinear frequency doubling. The fundamental wavelength is filtered out by the filter (32). The beam profile of the frequency-doubled laser beam corresponds to that of the fundamental wavelength in front of the BBO crystal (31), i.e. it is spatially modulated. The lens (4) images the plane of the BBO crystal (31) in reduced size onto the MALDI sample support (7) via the tilting mirror (5), and generates a spatially modulated intensity distribution on the MALDI sample (6). In this embodiment, the temporal pulse generation is carried out by pumping the diode laser array (29) with a pulse of electric current.

With knowledge of the invention, those skilled in the art can design further embodiments of the MALDI ion source according to the invention.

What is claimed is:

1. Ion source generating ions by matrix-assisted laser desorption/ionization (MALDI), comprising a MALDI sample support and a solid-state laser system generating a laser beam, which is temporally pulsed and has a wavelength in the range between 332 and 342 nanometers, wherein at least one optical or electro-optical component of the solid-state laser system spatially shapes the laser beam such that the spatial intensity distribution of the laser beam on the MALDI sample support exhibits more than one intensity peak.

2. Ion source according to claim 1, wherein the solid-state laser system comprises a crystal doped with ions or a glass doped with ions as laser medium.

3. Ion source according to claim 1, wherein the solid-state laser system comprises a semiconductor laser diode with one single emitter or a plurality of single emitters.

4. Ion source according to claim 1, wherein the laser beam emitted by the laser medium has a wavelength in the range between 664 and 684 nanometers.

5. Ion source according to claim 4, wherein the solid-state laser system comprises a semiconductor laser diode and the laser medium consists of alternate layers of gallium indium phosphide (Ga)(InP) and aluminum gallium indium phosphide (AlGa)(InP) emitting a laser beam at a wavelength of 674 nanometers.

6. Ion source according to claim 1, wherein the laser beam emitted by the laser medium has a wavelength in the range between 996 and 1026 nanometers.

7. Ion source according to claim 6, wherein the solid-state laser system comprises a semiconductor laser diode and the laser medium consists of alternate layers of gallium indium arsenide (GaIn)(As) and gallium arsenide (Ga)(As) emitting a laser beam at a wavelength of 1011 nanometers.

8. Ion source according to claim 1, wherein the laser beam emitted by the laser medium has a wavelength in the range between 1328 and 1368 nanometers.

9. Ion source according to claim 8, wherein the laser medium is a $YAlO_3$ crystal doped with neodymium ions emitting a laser beam at a wavelength of 1341 nanometers.

10. Ion source according to claim 8, wherein the laser medium is a $YVO_4$ crystal doped with neodymium ions emitting a laser beam at a wavelength of 1342 nanometers.

11. Ion source according to one of the claim 4, wherein the wavelength of the laser beam emitted by the laser medium is converted into a wavelength in the range between 332 and 342 nanometers by generating higher order harmonics in nonlinear crystals.

12. Ion source according to claim 1, wherein the at least one optical or electro-optical component is adjustable to create different spatial intensity distributions of the laser beam on the MALDI sample support.

* * * * *